(12) United States Patent
Chang et al.

(10) Patent No.: US 12,111,583 B2
(45) Date of Patent: Oct. 8, 2024

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Kai-Chieh Chang, Changhua (TW); Kai-Fa Ho, New Taipei (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/446,698

(22) Filed: Aug. 9, 2023

(65) Prior Publication Data
US 2024/0019789 A1 Jan. 18, 2024

Related U.S. Application Data

(62) Division of application No. 17/446,254, filed on Aug. 27, 2021, now Pat. No. 11,822,256.
(Continued)

(51) Int. Cl.
*G03F 7/00* (2006.01)

(52) U.S. Cl.
CPC ...... *G03F 7/70741* (2013.01); *G03F 7/70033* (2013.01); *G03F 7/70633* (2013.01); *G03F 7/70875* (2013.01); *G03F 7/70891* (2013.01)

(58) Field of Classification Search
CPC ............ G03F 7/70741; G03F 7/70033; G03F 7/70633; G03F 7/70875; G03F 7/70891; G03F 7/70733
See application file for complete search history.

(56) References Cited

U.S. PATENT DOCUMENTS 6,445,439 B1 * 9/2002 McCullough ....... G03F 7/70866
355/75
11,243,478 B2 * 2/2022 Yang ................... G03F 7/70875
(Continued)

FOREIGN PATENT DOCUMENTS

JP 6034972 B2 11/2016
WO 2014048651 A1 4/2014

*Primary Examiner* — Hung V Nguyen
(74) *Attorney, Agent, or Firm* — Harrity & Harrity, LLP

(57) ABSTRACT

A reticle is pre-heated prior to an exposure operation of a semiconductor substrate lot to reduce substrate to substrate temperature variations of the reticle in the exposure operation. The reticle may be pre-heated while being stored in a reticle storage slot, while being transferred from the reticle storage slot to a reticle stage of an exposure tool, and/or in another location prior to being secured to the reticle stage for the exposure operation. In this way, the reduction in temperature variation of the reticle in the exposure operation provided by pre-heating the reticle may reduce overlay deltas and misalignment for the semiconductor substrates that are processed in the exposure operation. This increases overlay performance, increases yield of the exposure tool, and increases semiconductor device quality. Moreover, pre-heating the reticle prior to securing the reticle to the reticle stage for the exposure operation reduces and/or minimizes the impact that the pre-heating has on throughput and processing times of the exposure tool.

20 Claims, 15 Drawing Sheets

Related U.S. Application Data

(60) Provisional application No. 63/201,626, filed on May 6, 2021.

(56) References Cited

U.S. PATENT DOCUMENTS

| | | |
|---|---|---|
| 11,372,341 B2 | 6/2022 | Lof et al. |
| 11,693,326 B1 * | 7/2023 | Pan ................... G03F 7/70891 355/30 |
| 2006/0256305 A1 * | 11/2006 | Won ..................... G03B 27/52 355/75 |
| 2007/0211232 A1 | 9/2007 | Phillips et al. |
| 2015/0192856 A1 | 7/2015 | Onvlee et al. |
| 2017/0052460 A1 | 2/2017 | Yoneda et al. |
| 2022/0357676 A1 | 11/2022 | Chang et al. |

* cited by examiner

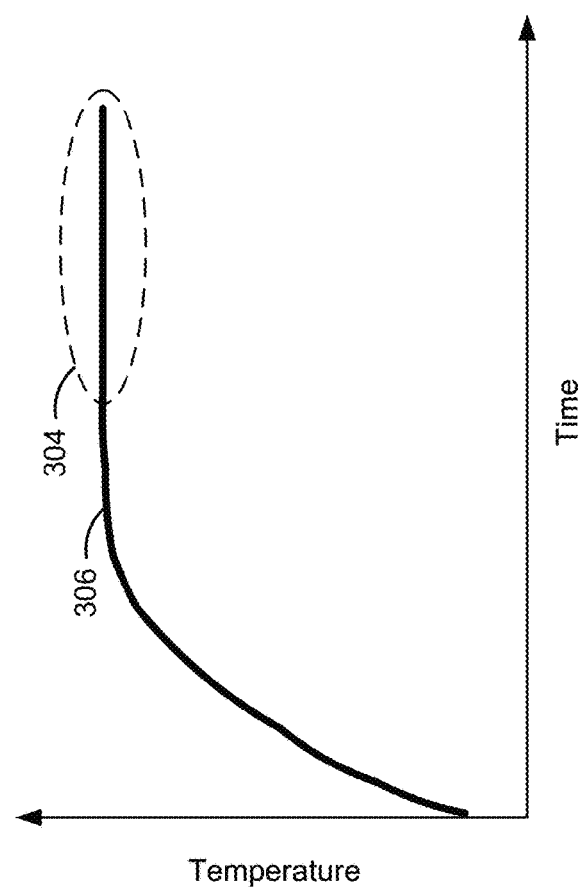

SEMICONDUCTOR PROCESSING TOOL AND METHODS OF OPERATION

CROSS-REFERENCE TO RELATED APPLICATION

This application is a divisional of U.S. patent application Ser. No. 17/446,254, filed on Aug. 27, 2021, which claims priority to U.S. Provisional Patent Application No. 63/201,626, filed on May 6, 2021, the contents of which are incorporated herein by reference in their entireties.

BACKGROUND

As semiconductor device sizes continue to shrink, some lithography technologies suffer from optical restrictions, which lead to resolution issues and reduced lithography performance. In comparison, extreme ultraviolet (EUV) lithography can achieve much smaller semiconductor device sizes and/or feature sizes through the use of reflective optics and radiation wavelengths of approximately 13.5 nanometers or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3I are diagrams of an example implementation described herein.

DETAILED DESCRIPTION

Figure 1:
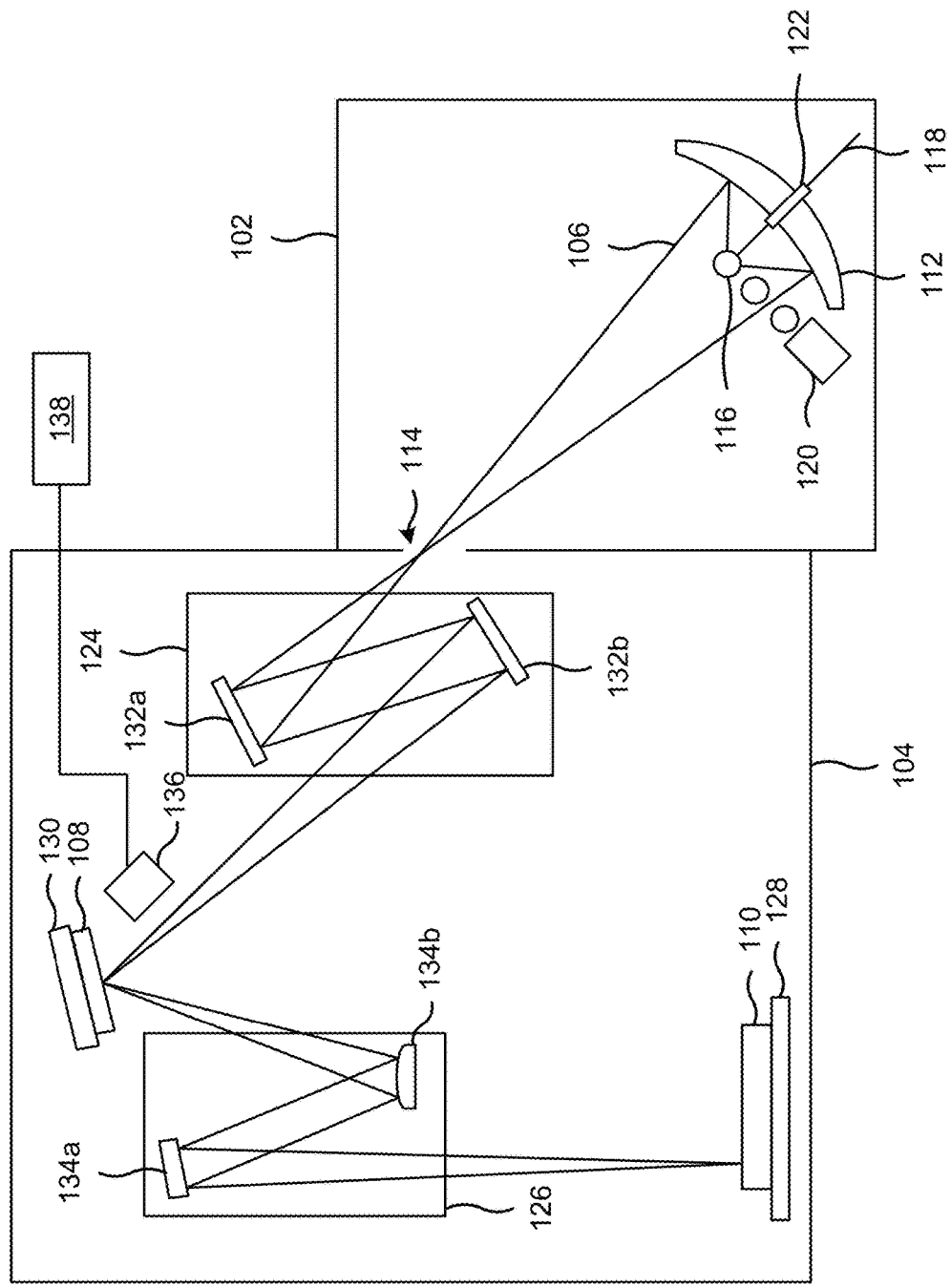
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor substrates are exposed to electromagnetic radiation in an exposure operation to form a pattern in photoresist layers on the semiconductor substrates. The semiconductor substrates are processed in a lot or batch in which the pattern is transferred from a reticle (or photomask) to the semiconductor substrates by exposing the semiconductor substrates to electromagnetic radiation. Exposure to the electromagnetic radiation causes the temperature of the reticle to rise across sequential exposures of a plurality of the semiconductor substrates. In some cases, the temperature of a reticle may vary throughout the exposure operation of a semiconductor substrate lot. The variation in heating during the exposure operation is difficult to estimate and to address with an appropriate offset. This may cause overlay deltas on a semiconductor substrate and/or overlay deltas from substrate to substrate, which may result in overlay or pattern misalignment. Overlay or pattern misalignment may result in misalignment of semiconductor structures on a semiconductor substrate, which may result in an increase in device failures and defects, and/or may result in reduced semiconductor processing yield, among other examples.

In some implementations described herein, a reticle is pre-heated prior to an exposure operation of a semiconductor substrate lot to reduce substrate to substrate temperature variations of the reticle in the exposure operation. The reticle may be pre-heated while being stored in a reticle storage slot, while being transferred from the reticle storage slot to a reticle stage of an exposure tool, and/or in another location prior to being secured to the reticle stage for the exposure operation. In this way, the reduction in temperature variation of the reticle in the exposure operation provided by pre-heating the reticle may reduce overlay deltas and misalignment for the semiconductor substrates that are processed in the exposure operation. This increases overlay performance, increases yield of the exposure tool, and increases semiconductor device quality. Moreover, pre-heating the reticle prior to securing the reticle to the reticle stage for the exposure operation reduces and/or minimizes the impact that the pre-heating has on throughput and processing times of the exposure tool.

FIG. 1 is a diagram of an example lithography system 100 described herein. The lithography system 100 includes an EUV lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV exposure tool or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a collector 112, which includes a curved mirror that is configured to collect the radiation 106 generated by the radiation source 102 and to focus the radiation 106 toward an intermediate focus 114. The radiation 106 is produced from a plasma that is generated from droplets 116 (e.g., tin (Sn) droplets or another type of droplets) being exposed to a laser 118. The droplets 116 are provided across the front of the collector 112 by a droplet generator (DG) head 120. The DG head 120 is pressurized to provide a fine and controlled output of the droplets 116. The laser 118 is provided through an opening 122 such that the plasma is generated in front of the collector 112. The laser 118 is pulsed at a timing that is synchronized with the flow of the droplets 116 from the DG head 120.

The exposure tool 104 includes an illuminator 124 and a projection optics box (POB) 126. The projection optics box 126 includes a plurality of mirrors that are configured to project the radiation 106 onto the semiconductor substrate 110 after the radiation 106 is modified based on the pattern of the reticle 108. The exposure tool 104 includes a substrate stage 128 (e.g., a wafer stage) configured to support the semiconductor substrate 110. Moreover, the substrate stage 128 is configured to move (or step) the semiconductor substrate 110 through a plurality of exposure fields as the radiation 106 transfers the pattern from the reticle 108 onto the semiconductor substrate 110.

The exposure tool includes a reticle stage 130 configured to support and/or secure the reticle 108. Moreover, the reticle stage 130 is configured to move or slide the reticle through the radiation 106 such that the reticle 108 is scanned by the radiation 106. In this way, a pattern that is larger than the field or beam of the radiation 106 may be transferred to the semiconductor substrate 110.

The illuminator 124 includes a plurality of reflective mirrors that are configured to focus and/or direct the radiation 106 onto the reticle 108 so as to illuminate the pattern on the reticle 108. The illuminator 124 includes a mirror 132a, a mirror 132b, and/or one or more other mirrors such as a relay mirror and/or another type of mirror. The mirror 132a includes a field facet mirror (FFM) or another type of mirror that includes a plurality of field facet elements. The mirror 132b includes a pupil facet mirror (PFM) or another type of mirror that also includes a plurality of pupil facets. The facets of the mirrors 132a and 132b are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation).

The projection optics box 126 includes a plurality of reflective mirrors such as the mirror 134a and 134b. In some implementations, the mirrors 134a and 134b are configured to focus or reduce the radiation 106 into an exposure field, which may include one or more die areas on the semiconductor substrate 110.

In an example exposure operation (e.g., an EUV exposure operation), the DG head 120 provides the stream of droplets 116 across the front of the collector 112. The laser 118 contacts the droplets 116, which causes a plasma to be generated. The plasma emits or produces radiation 106 (e.g., light). The radiation 106 may include EUV radiation having a wavelength of approximately 13.5 nanometers or less. The radiation 106 is collected by the collector 112 and directed out of the radiation source 102 and into the exposure tool 104 toward the mirror 132a of the illuminator 124. The mirror 132a reflects the radiation 106 onto the mirror 132b, which reflects the radiation 106 onto the reticle 108. The radiation 106 is modified by the pattern in the reticle 108. In other words, the radiation 106 reflects off of the reticle 108 based on the pattern of the reticle 108. The reticle 108 directs the radiation 106 toward the mirror 134b in the projection optics box 126, which reflects the radiation 106 onto the mirror 134a. The mirror 134a reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As further shown in FIG. 1, the exposure tool 104 includes a thermal camera 136. The thermal camera 136 is positioned near the reticle stage 130. The thermal camera 136 is configured to generate sensor data associated with the reticle 108. In particular, the thermal camera 136 is configured to generate temperature data associated with the reticle 108. The temperature data is generated during and/or throughout an exposure operation performed by the lithography system 100. In this way, the thermal camera 136 and the generated temperature data may be used to monitor the temperature of the reticle 108 during the exposure operation. The exposure operation may include processing of a semiconductor substrate lot, in which a plurality of semiconductor substrates 110 are sequentially exposed to the radiation 106 to transfer the pattern (e.g., the same pattern) of the reticle 108 to each of the semiconductor substrates 110 in the semiconductor substrate lot.

As an example, the thermal camera 136 may generate the temperature data associated with the reticle 108 while the lithography system 100 transfers the pattern of the reticle 108 to a plurality of exposure fields (e.g., semiconductor die fields or other types of exposure fields) on a first semiconductor substrate 110 in the semiconductor substrate lot. The thermal camera 136 may continue to generate the temperature data associated with the reticle 108 while the lithography system 100 transfers the pattern of the reticle 108 to a plurality of exposure fields (e.g., semiconductor die fields or other types of exposure fields) on a second semiconductor substrate 110 in the semiconductor substrate lot. The thermal camera 136 may generate the temperature data associated with the reticle 108 while the lithography system 100 transfers the pattern of the reticle 108 to a plurality of exposure fields (e.g., semiconductor die fields or other types of exposure fields) on subsequent semiconductor substrates in the semiconductor substrate lot.

The thermal camera 136 includes a thermographic camera, a thermal imaging camera, an infrared camera, or another type of camera that is capable of generating thermal images and/or thermal video representing the temperature of the reticle 108. The thermal camera 136 is also configured to transmit and/or otherwise provide the temperature data to a controller 138 included in and/or associated with the lithography system 100. The controller 138 may be included in a computing system of the lithography system 100, a component of the lithography system 100 (e.g., the exposure tool 104), or a computing system that is external to the lithography system 100. The controller 138 communicates with the thermal camera 136 to receive the temperature data from the thermal camera 136 by a wireless communication connection and/or a wireline communication connection.

As described in greater detail herein, the controller 138 is configured to determine and/or modify, based on the temperature data received from the thermal camera 136, one or more parameters for heating (e.g., pre-heating) the reticle 108 prior to an exposure operation in which the reticle 108 is used to transfer a pattern to a plurality of semiconductor substrates 110 in a semiconductor substrate lot. In this way, the reticle 108 is pre-heated based on the temperature data from one or more historical exposure operations to reduce temperature variation of the reticle 108 in the exposure operation.

As indicated above, FIG. 1 is provided as an example. Other examples may differ from what is described with regard to FIG. 1.

Figure 2A:
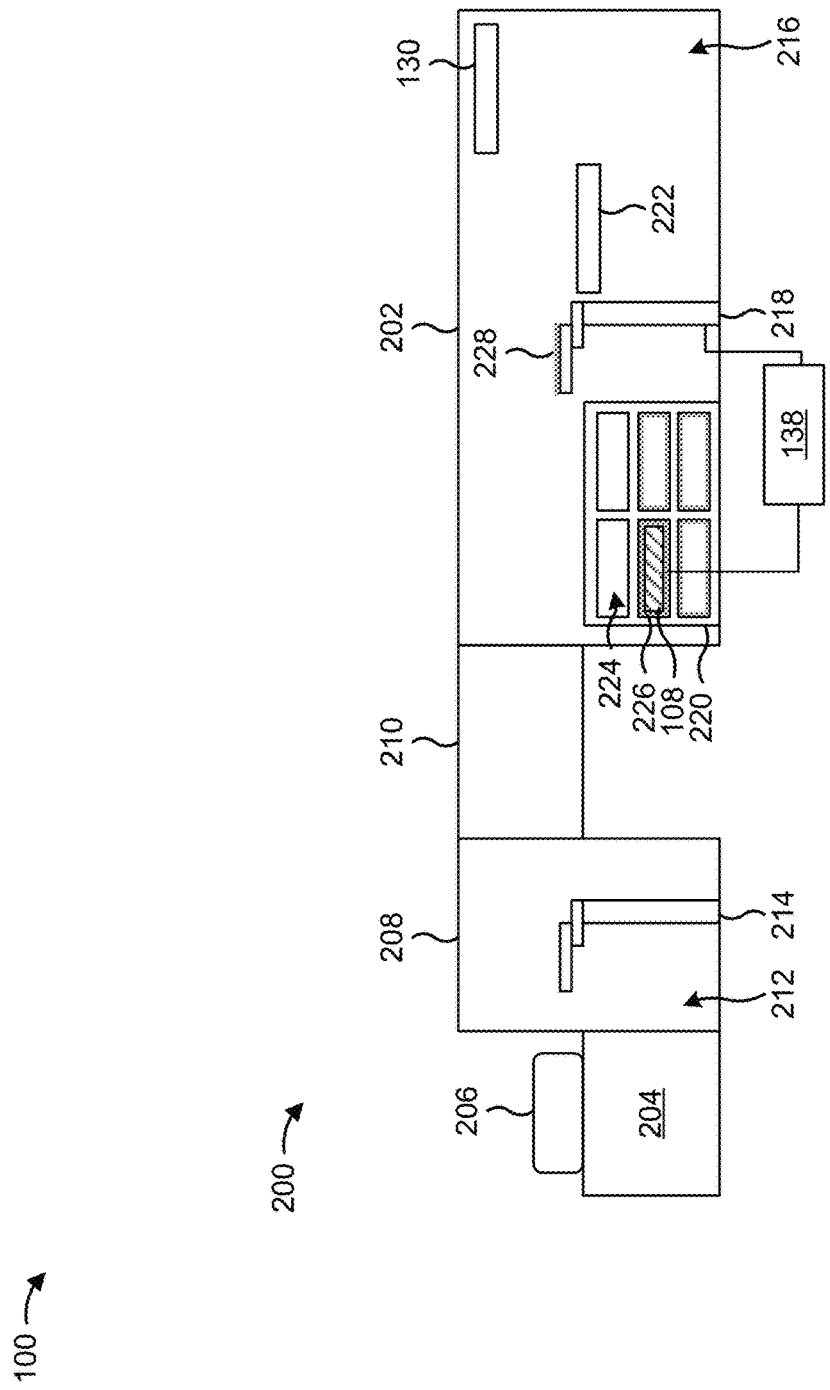
FIGS. 2A and 2B are diagrams of an example reticle transport system described herein for use in the example lithography system of FIG. 1.
Figure 2B:
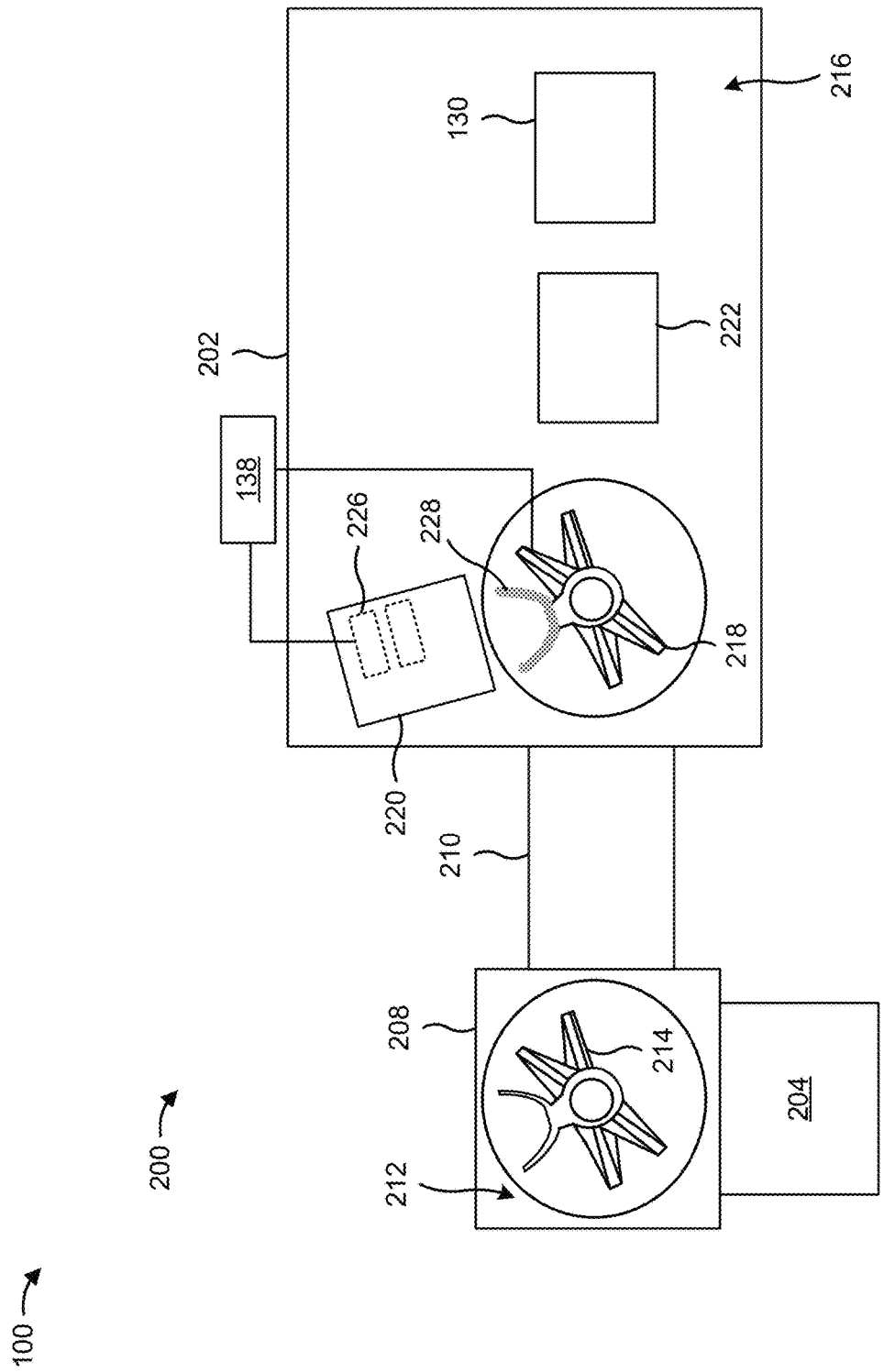

FIGS. 2A and 2B are diagrams of an example reticle transport system 200 described herein for use in the example lithography system 100 of FIG. 1. FIG. 2A illustrates a cross-sectional elevation view of the reticle transport system 200. FIG. 2B illustrates a top-down (or plan) view of the reticle transport system 200. The reticle transport system 200 is configured to transport reticles 108 to and/or from the reticle stage 130, configured to store reticles 108 that are not in use in the exposure tool 104, configured to provide reticles 108 to and/or receive reticles 108 from other transport systems in a semiconductor processing environment, and/or configured to perform other functions associated with reticles 108 that are used in the exposure tool 104. The reticle transport system 200 may be included in an enclosure of the lithography system 100. In some implementations, portions of the reticle transport system 200 are included in the exposure tool 104.

As shown in FIGS. 2A and 2B, the reticle transport system 200 includes a chamber 202 in which the reticle stage 130 is located. The reticle transport system 200 includes a load port 204 on which a reticle carrier 206 may be positioned and/or supported. The load port 204 is configured to receive the reticle carrier 206 from and/or provide the reticle carrier 206 to a transport tool such as an overhead hoist transport (OHT) system or another type of transport tool. The reticle carrier 206 includes a reticle pod or another type of carrier that is configured to protect a reticle 108 from contamination and/or physical damage during transport and/or storage of the reticle 108.

An interface tool 208 is configured to transfer reticles 108 between the load port 204 and a load lock chamber 210. The interface tool 208 includes an equipment front end module (EFEM) or similar type of interface tool that is situated between the load port 204 and the load lock chamber 210. The interface tool 208 includes a chamber 212 that is sealed from the external environment outside the lithography system 100 to reduce and/or minimize contamination of reticles 108 that are transferred through the interface tool 208.

The interface tool 208 may further include a reticle transport tool 214 in the chamber 212. The reticle transport tool 214 may include a robotic arm, a reticle transport robot, or another type of tool that is configured to transport a reticle 108 between the reticle carrier 206 and the chamber 202 through the load lock chamber 210. The load lock chamber 210 includes a chamber that is configured to permit the transfer of reticles 108 between the interface tool 208 and the chamber 202 while maintaining environmental isolation between the interface tool 208 and the chamber 202.

The chamber 202 includes an internal space 216 in which a reticle transport tool 218 is located. The reticle transport tool 218 includes a robotic arm, a reticle transport robot, or another type of tool that is configured to transport reticles between the chamber 202 and the load lock chamber 210. The chamber 202 further includes a reticle storage device 220 (e.g., a reticle library or another type of reticle storage device) that is configured to support and/or store a plurality of reticles 108. The reticle transport tool 218 is configured to transport reticles 108 between the reticle storage device 220 and/or the load lock chamber 210 and an exchanging station 222.

The exchanging station 222 is configured to support a reticle 108. The exchanging station 222 is further configured to move to various locations within the internal space 216 to position a reticle 108 for securing to the reticle stage 130 and/or to position a reticle 108 for retrieval by the reticle transport tool 218, among other examples.

The reticle stage 130 includes an electrostatic chuck that is configured to secure a reticle 108 in place for an exposure operation by an electrostatic clamp. The reticle stage 130 may form the electrostatic clamp by generating an electric potential (or an electrostatic field) between the reticle stage 130 and the reticle 108. The electric potential secures the reticle 108 to the reticle stage 130. The reticle stage 130 may release the electrostatic clamp so that the reticle 108 may be returned to the exchanging station 222, and so that another reticle 108 may be secured to the reticle stage 130 for another exposure operation.

As further shown in FIG. 2A, the reticle storage device 220 includes a plurality of reticle storage slots 224. Each reticle storage slot 224 is configured to store a reticle 108 (e.g., when the reticle 108 is not in use). One or more of the reticle storage slots 224 include a respective reticle heater 226. A reticle heater 226 is configured to heat a reticle 108 in the associated reticle storage slot 224. A reticle heater 226 includes an electric heater, a thermoelectric heater, or another type of heater that is capable of increasing the temperature of a reticle 108 while the reticle 108 stored in the associated reticle storage slot 224. A reticle heater 226 may be used to pre-heat a reticle 108 prior to an exposure operation in which the reticle 108 is to be used.

Another reticle heater 228 may be included on the reticle transport tool 218. In particular, the reticle heater 228 may be included on a portion of the reticle transport tool 218 that physically contacts a reticle 108 or is near the reticle 108 when the reticle transport tool 218 transfers the reticle 108. In some implementations, either the reticle heater 226 or the reticle heater 228 is included in the reticle transport system 200 to heat reticles 108. In some implementations, both reticle heaters 226 and 228 are included in the reticle transport system 200. In these implementations, the reticle heater 226 or the reticle heater 228 may be used to pre-heat a reticle 108. Moreover, the reticle heater 226 may be used to pre-heat a reticle 108, and the reticle heater 228 may be used to maintain the pre-heated temperature of the reticle 108 after the reticle heater 226 pre-heats the reticle 108.

As further shown in FIGS. 2A and 2B, the controller 138 is communicatively connected to various components of the reticle transport system 200. In particular, the controller 138 is communicatively connected to the reticle heaters 226 included in the reticle storage device 220 (e.g., communicatively connected directly to the reticle heaters 226 and/or communicatively connected to the reticle heaters 226 through the reticle storage device 220). Moreover, the controller 138 is communicatively connected to the reticle heater 228 included on the reticle transport tool 218 (e.g., communicatively connected directly to the reticle heater 228 and/or communicatively connected to the reticle heater 228 through the reticle transport tool 218). The communicative connections with the reticle heaters 226 and 228 include wireless connections, wireline connections, or a combination thereof. In some implementations, the controller 138 is communicatively connected to other components of the reticle transport system 200, such as the reticle transport tool 214, the reticle transport tool 218, and/or the exchanging station 222, among other examples.

The controller 138 is configured to transmit signals to the reticle heaters 226 and 228. The signals include analog signals, digital signals, or a combination thereof. The signals include voltages, currents, digital communications (e.g., packets), and/or other types of signals. The controller 138 may transmit a signal to a reticle heater (e.g., a reticle heater 226, a reticle heater 228) to cause the reticle heater to activate reticle heater, to initiate the reticle heater, and/or to otherwise cause the reticle heater to actively emit heat. The controller 138 may transmit a signal to a reticle heater (e.g., a reticle heater 226, a reticle heater 228) to cause the reticle heater to deactivate reticle heater, to turn the reticle heater off, and/or to otherwise cause the reticle heater to stop actively emitting heat (the reticle heater may still emit passive heat, in some cases, due to thermal inertia after being deactivated).

As indicated above, FIGS. 2A and 2B are provided as an example. Other examples may differ from what is described with regard to FIGS. 2A and 2B.

FIGS. 3A-3I are diagrams of an example implementation 300 described herein. The example implementation 300 includes one or more examples of heating (or pre-heating) a reticle 108 prior to an exposure operation in which the reticle 108 is used to transfer a pattern to a plurality of semiconductor substrates 110 in a semiconductor substrate lot.

Figure 3A:
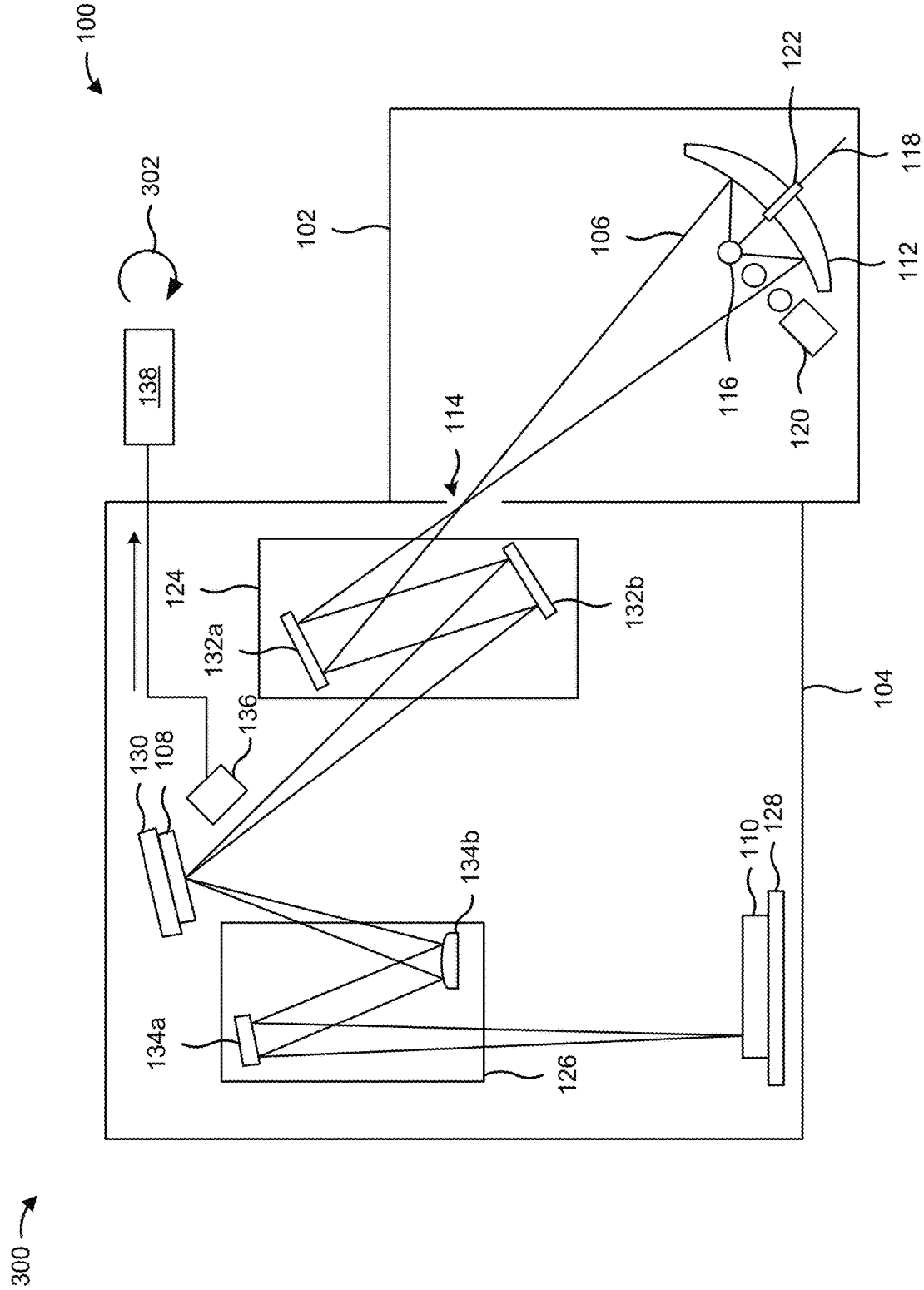

As shown in FIG. 3A, the lithography system 100 performs an exposure operation in which a semiconductor substrate lot of a plurality of semiconductor substrates 110 are processed to transfer a pattern of a reticle 108 to the plurality of semiconductor substrates 110. In the exposure operation, the pattern is transferred to a plurality of exposure fields of a first semiconductor substrate 110 of the semiconductor substrate lot. The first semiconductor substrate 110 is then replaced on the substrate stage 128 with a second semiconductor substrate 110 of the semiconductor substrate lot, and the pattern is transferred to a plurality of exposure fields of the second semiconductor substrate 110. The second semiconductor substrate 110 is then replaced on the substrate stage 128 with a third semiconductor substrate 110 of the semiconductor substrate lot, and the pattern is transferred to a plurality of exposure fields of the third semiconductor substrate 110. The exposure operation continues accordingly until the semiconductor substrates 110 in the substrate lot are processed.

During the exposure operation, the thermal camera 136 monitors the temperature of the reticle 108 as the semiconductor substrates 110 are processed. In particular, the thermal camera 136 generates temperature data associated with the temperature of the reticle 108 while the semiconductor substrates 110 are processed in the exposure operation. The thermal camera 136 provides the temperature data to the controller 138. The temperature data is provided in the form of a voltage, a current, a resistance, a communication, and/or another form of signal. The controller 138 receives the temperature data from thermal camera 136. The controller 138 may receive the temperature data as a data stream (e.g., as the thermal data is generated), as a buffered or cached transfer (e.g., after all of the temperature data is generated), or by another data transfer technique.

As shown by reference number 302, the controller 138 determines one or more heating parameters based on the temperature data associated with the exposure operation. In some implementations, the controller 138 determines the one or more heating parameters based on temperature data associated with one or more additional (historical) exposure operations in which the reticle 108 was used. The one or more historical exposure operations include exposure operations in which the same or similar exposure parameters are used, such as the same or similar power level (or light intensity) used for the radiation source 102, the same or similar exposure duration, the same or similar exposure dosage (e.g., the amount of energy per unit area transferred to the semiconductor substrates 110 in the exposure operation), and/or the same or similar pupil size and/or shape of the mirror 132b, among other examples.

As shown in FIG. 3B, the controller 138 determines the one or more heating parameters based on a saturation temperature 304 of the reticle 108. The controller 138 determines the saturation temperature 304 based on the temperature data from the exposure operation (and the one or more historical exposure operations). The saturation temperature 304 includes the measured or estimated temperature of the reticle 108 at which the temperature does not increase further during the exposure operation (and, in some cases, during the one or more historical exposure operations). As an example, and as shown in FIG. 3B, the temperature 306 of the reticle 108 increases from the beginning of the exposure operation as semiconductor substrates 110 are processed until the temperature 306 reaches the saturation temperature 304, at which the temperature 306 reaches a steady state and does not increase further. In some implementations, the controller 138 determines the saturation temperature 304 as an average of the saturation temperatures that were measured for the exposure operation and the one or more historical exposure operations.

In some implementations, the controller 138 determines the saturation temperature 304 for a subsequent exposure operation in which the reticle 108 is to be used. If one or more exposure parameters for the subsequent exposure operation are different, the controller 138 may determine the saturation temperature 304 based on additional factors, such as the radiation dosage for the subsequent exposure operation (e.g., a greater radiation dosage may increase the saturation temperature 304, whereas a lesser radiation dosage may decrease the saturation temperature 304), the radiation source energy level for the subsequent exposure operation (e.g., a greater energy level may increase the saturation temperature 304, whereas a lesser energy level may decrease the saturation temperature 304), and/or another exposure parameter.

The controller 138 determines the one or more heating parameters such that the one or more heating parameters result in the reticle 108 being pre-heated (e.g., for an exposure operation) to a temperature that is equal to (or approximately equal to) the saturation temperature 304. The reticle 108 is pre-heated to (or close to) the saturation temperature 304 (which may be an estimated saturation temperature for the exposure operation) to reduce or minimize temperature variation of the reticle 108 during the exposure operation. In other words, the reticle 108 is pre-heated to (or close to) the saturation temperature 304 such that the amount of time from the beginning of the exposure operation to the time in the exposure operation at which the temperature of the reticle 108 reaches the saturation temperature 304 is reduced or minimized. This reduces or minimizes the variation in deformation (e.g., deformation changes) of the reticle 108 during the exposure operation, which reduces or minimizes the deformation changes of the pattern on the reticle 108. This provides a more consistent and uniform pattern deformation of the pattern, which reduces the lot overlay heating error (e.g., the overlay error or misalignment in the exposure operation caused by temperature variation of the reticle 108).

In some implementations, the one or more heating parameters include a temperature parameter. In some implementations, the one or more heating parameters include a duration parameter. In some implementations, the one or more heating parameters include a combination of the temperature parameter and the duration parameter, and/or one or more other heating parameters. The temperature parameter includes a temperature setting at which a reticle heater 226 and/or 228 is set to pre-heat the reticle 108 (e.g., prior to an exposure operation). In some implementations, the temperature setting is equal to (or approximately equal to) the saturation temperature 304. In some implementations, the temperature setting is greater than the saturation temperature 304 to decrease the time duration of pre-heating the reticle 108 and/or to account for a drop in temperature of the reticle 108 during an initial waiting period between the reticle 108 being secured to the reticle stage 130 and the start of the exposure operation. The duration parameter includes a time duration for which the reticle 108 is pre-heated. In some implementations, the reticle 108 is pre-heated for a time duration in a range of approximately 5 minutes to approximately 10 minutes such that the reticle 108 is pre-heated to the saturation temperature 304. However, other time durations are within the scope of the present disclosure.

Figure 3C:
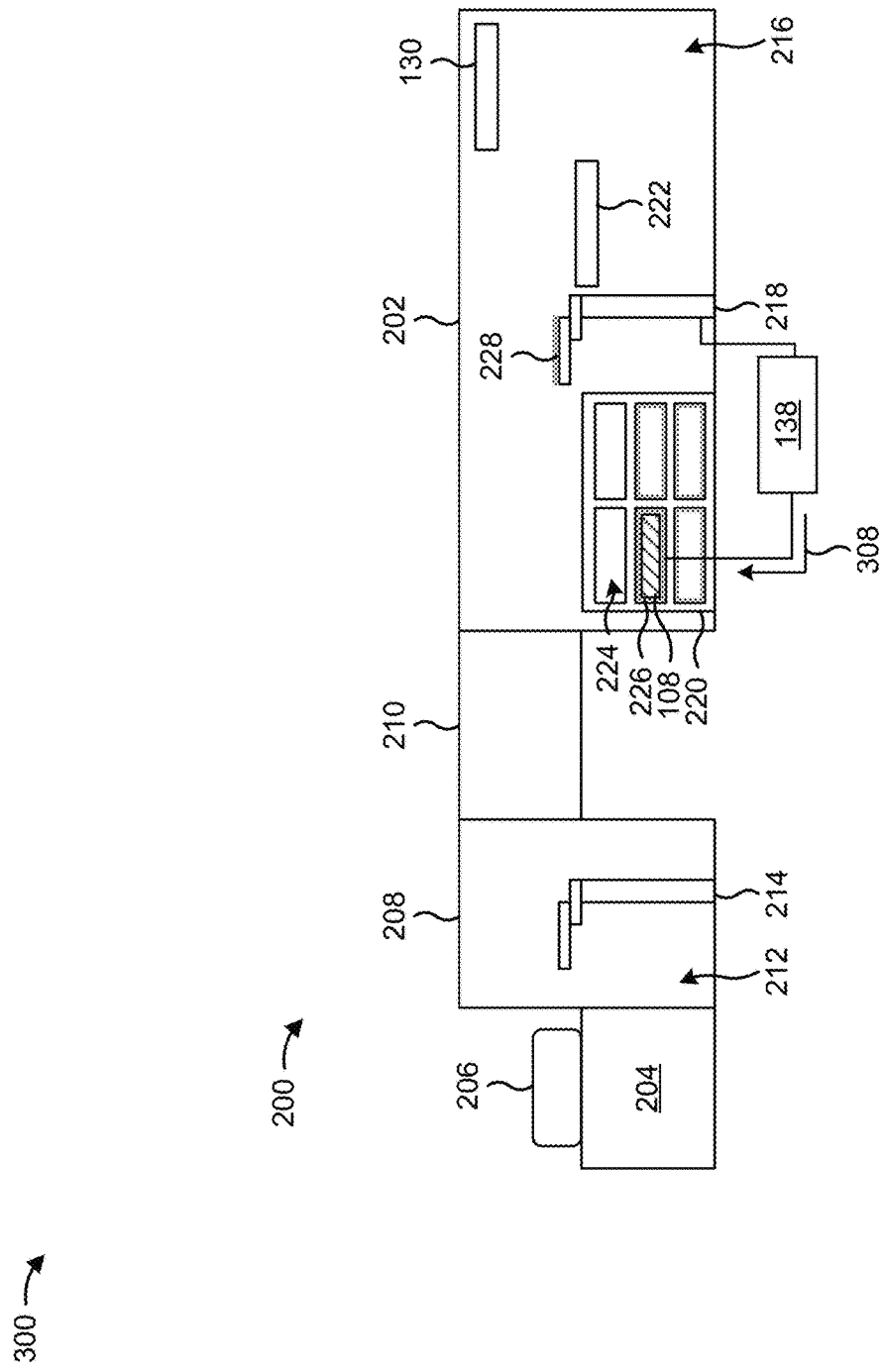

Turning to FIG. 3C, a reticle 108 is pre-heated in a reticle storage slot 224 of the reticle storage device 220 prior to an exposure operation in which the reticle 108 is to be used. In this way, the reticle 108 is pre-heated prior to transfer of the reticle 108 from the reticle storage slot 224 to the reticle stage 130 for the exposure operation. To pre-heat the reticle, the controller 138 transmits a signal 308 to a reticle heater 226 in the reticle storage slot 224. In some implementations, the controller 138 transmits the signal 308 to the reticle heater 226 based on determining that the reticle 108 is located in the reticle storage slot 224.

The signal causes the reticle heater 226 to be activated such that the reticle heater 226 heats the reticle 108 while the reticle 108 is in the reticle storage slot 224. In some implementations, the controller 138 transmits the signal 308 to the reticle heater 226 based on receiving input (e.g., from an operator of the lithography system 100). In some implementations, the controller 138 automatically transmits the signal 308 to the reticle heater 226 based on an event, such as a substrate lot job, in which the reticle 108 is to be used, being added to a processing queue of the lithography system 100. In some implementations, the controller 138 automatically transmits the signal 308 to the reticle heater 226 based on production schedule for the semiconductor substrate lot for which the reticle 108 is to be used to process, based on receiving a signal (e.g., from the reticle storage slot 224) indicating the location of the reticle 108, and/or other factors.

The signal 308 causes the reticle heater 226 to heat the reticle 108 based one or more heating parameters. For example, the signal 308 causes the reticle heater 226 to provide heat at (or within a tolerance of) a temperature parameter to heat the reticle 108. The temperature parameter may be equal to (or approximately equal to) the estimated saturation temperature (e.g., the saturation temperature 304) of the reticle 108 for the exposure operation. As another example, the signal 308 causes the reticle heater 226 to pre-heat the reticle 108 in the reticle storage slot 224 for a time duration that is based on a time duration parameter. In this way, the reticle 108 is pre-heated for the time duration in the reticle storage slot 224 prior to being retrieved by the reticle transport tool 218. In some implementations, the signal 308 causes the reticle heater 226 to pre-heat the reticle 108 at the temperature parameter for the time duration parameter.

Figure 3D:
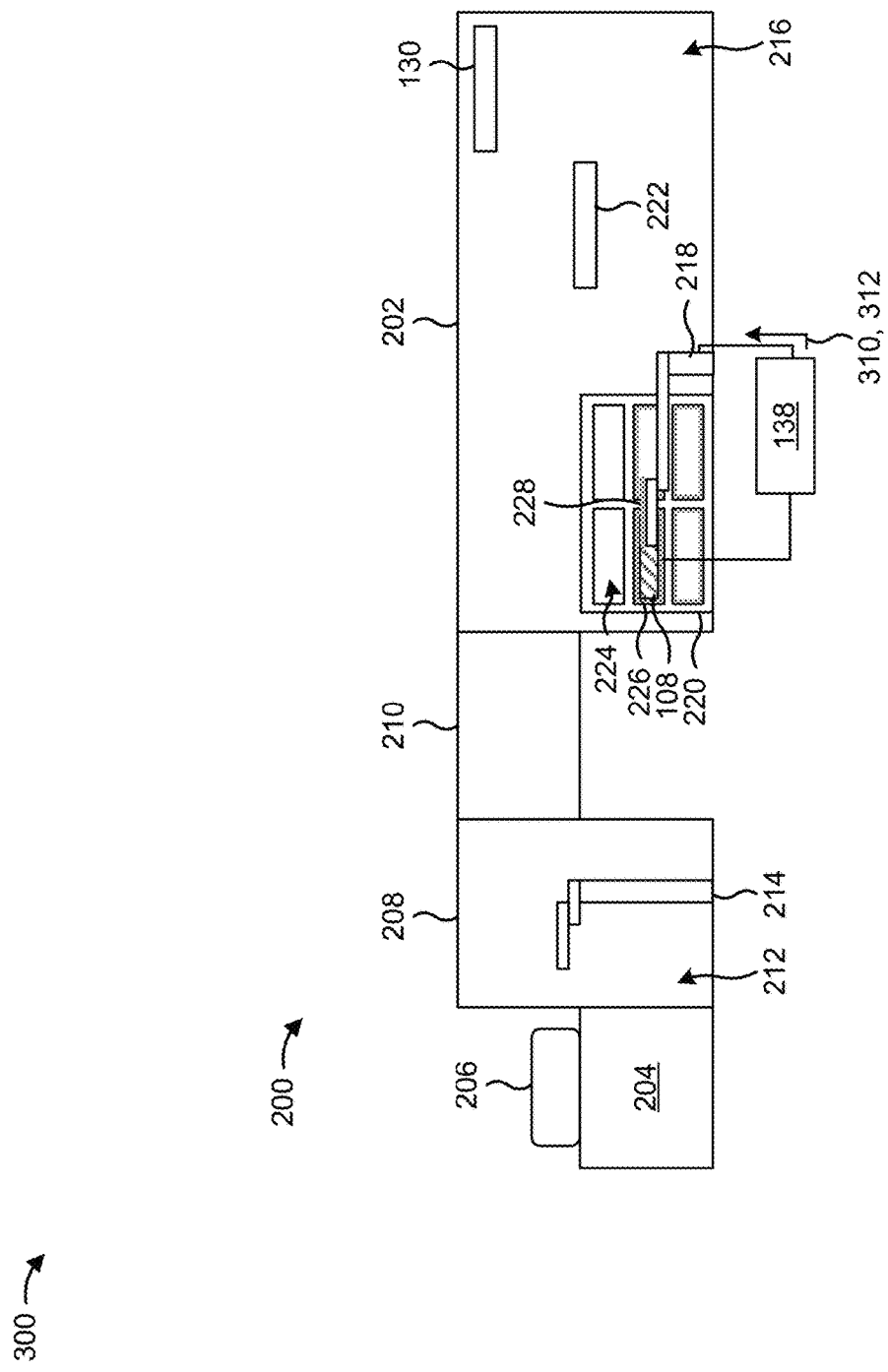

As shown in FIG. 3D, the controller 138 provides a signal 310 to the reticle transport tool 218 to cause the reticle transport tool 218 to retrieve the reticle 108 from the reticle storage slot 224. In some implementations, the controller 138 provides the signal 310 to cause the reticle transport tool 218 to retrieve the reticle 108 from the reticle storage slot 224 after the reticle is pre-heated to a temperature that is equal to (or approximately equal to) the estimated saturation temperature. In some implementations, the reticle storage slot 224 includes a thermal camera or another type of temperature sensor that is configured to generate temperature data so that the controller 138 may determine when the reticle 108 has reached the estimated saturation temperature. In some implementations, the controller 138 provides the signal 310 to cause the reticle transport tool 218 to retrieve the reticle 108 from the reticle storage slot 224 after the time duration of the duration parameter has expired.

As further shown in FIG. 3D, the controller 138 provides a signal 312 to the reticle heater 228 on the reticle transport tool 218 to cause the reticle heater 228 to be activated such that the reticle heater 228 provides heat to the reticle 108 during transport of the reticle 108 to the reticle stage 130. In some implementations, the reticle 108 is pre-heated using the reticle heater 228 while the reticle transport tool 218 transfers the reticle 108 to the exchanging station 222. In these implementations, the temperature of the reticle 108 is elevated from a storage temperature to the estimated saturation temperature on the reticle transport tool 218 using the reticle heater 228. In some implementations, the reticle 108 is pre-heated in the reticle storage slot 224 using the reticle heater 226 (e.g., based on a first signal (the signal 312) provided by the controller 138), and the signal 312 (a second signal) causes the reticle heater 228 to maintain the temperature of the reticle 108 at the pre-heated temperature during transfer of the reticle 108 to the reticle stage 130. In these implementations, the temperature of the reticle 108 is elevated from a storage temperature to the estimated saturation temperature in the reticle storage slot 224 using the reticle heater 226, and the temperature of the reticle 108 is then maintained at or near the estimated saturation temperature on the reticle transport tool 218 using the reticle heater 228. The reticle 108 may be pre-heated, or the temperature of the reticle 108 may be maintained using the reticle heater 228, based on the one or more heating parameters, including the temperature parameter and the duration parameter.

In some implementations, the reticle 108 is pre-heated in other locations (e.g., additionally and/or alternatively to the reticle storage slot 224 and/or the reticle transport tool 218), such as in an OHT vehicle, in a reticle carrier 206, on a load port 204, and/or in another location.

Figure 3E:
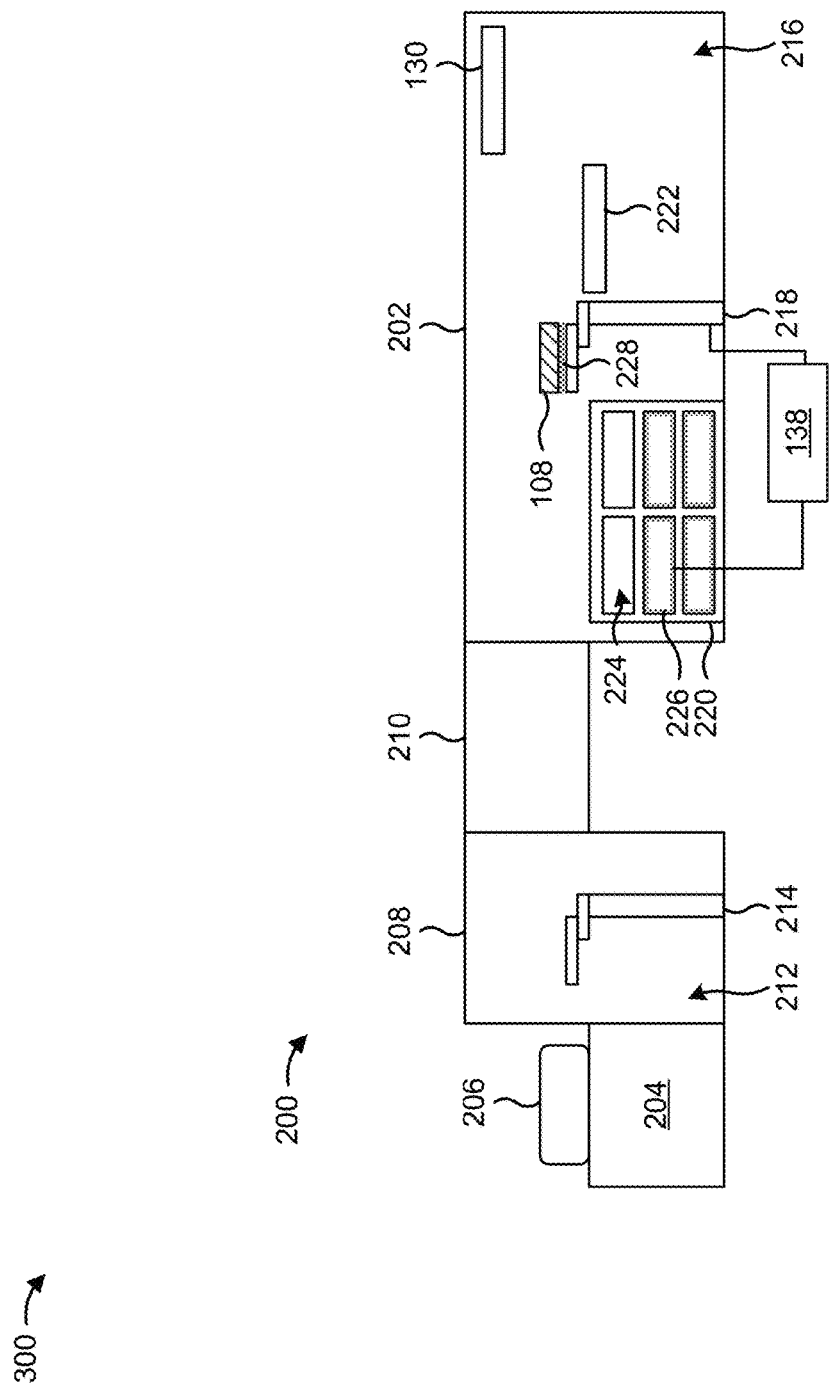
Figure 3F:
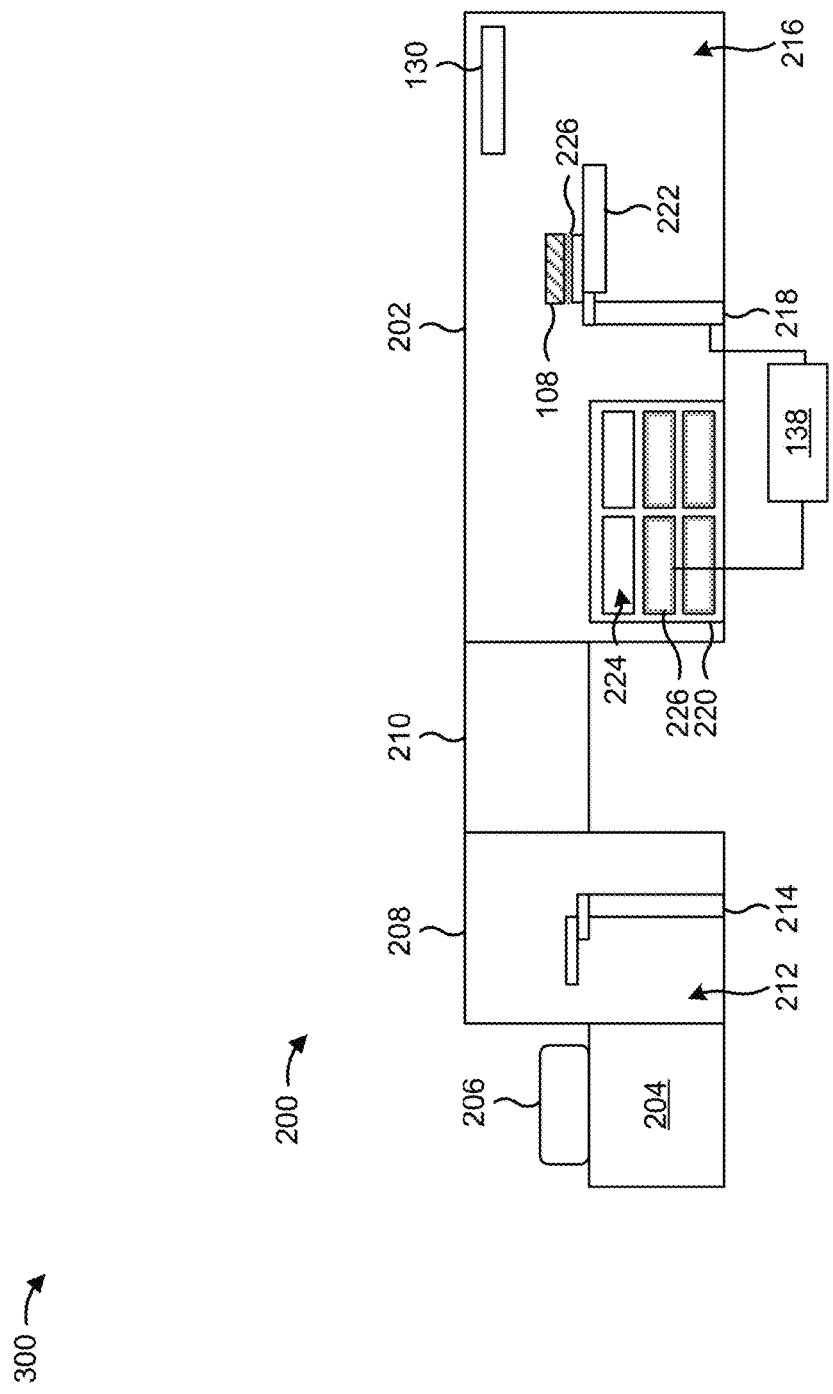
Figure 3G:
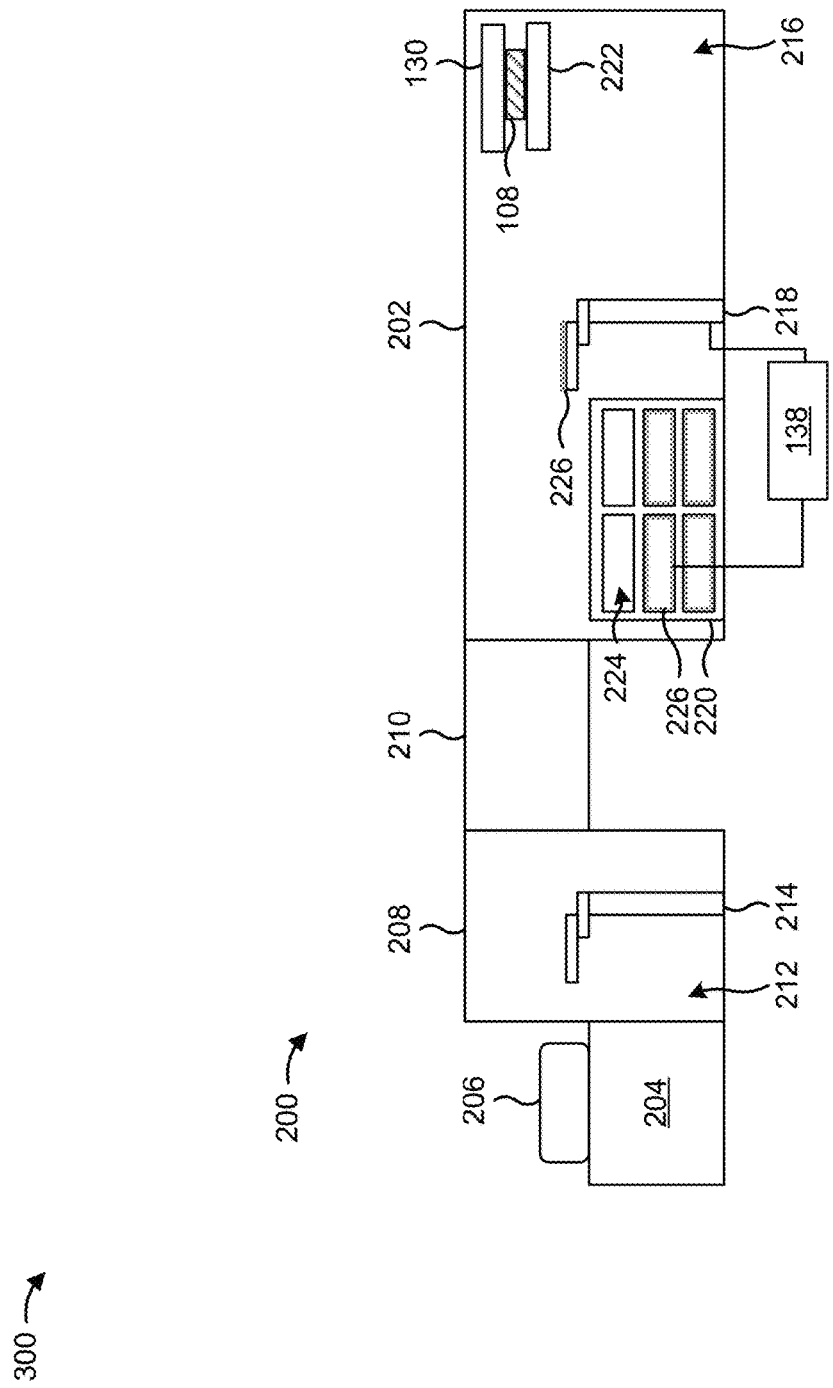

As shown in FIGS. 3E and 3F, the reticle transport tool 218 transfers the reticle 108 to the exchanging station 222. As shown in FIG. 3G, the exchanging station 222 positions the reticle 108 near or on the reticle stage 130. The reticle 108 is then secured to the reticle stage 130 (e.g., using an electrostatic force or another securing force).

Figure 3H:
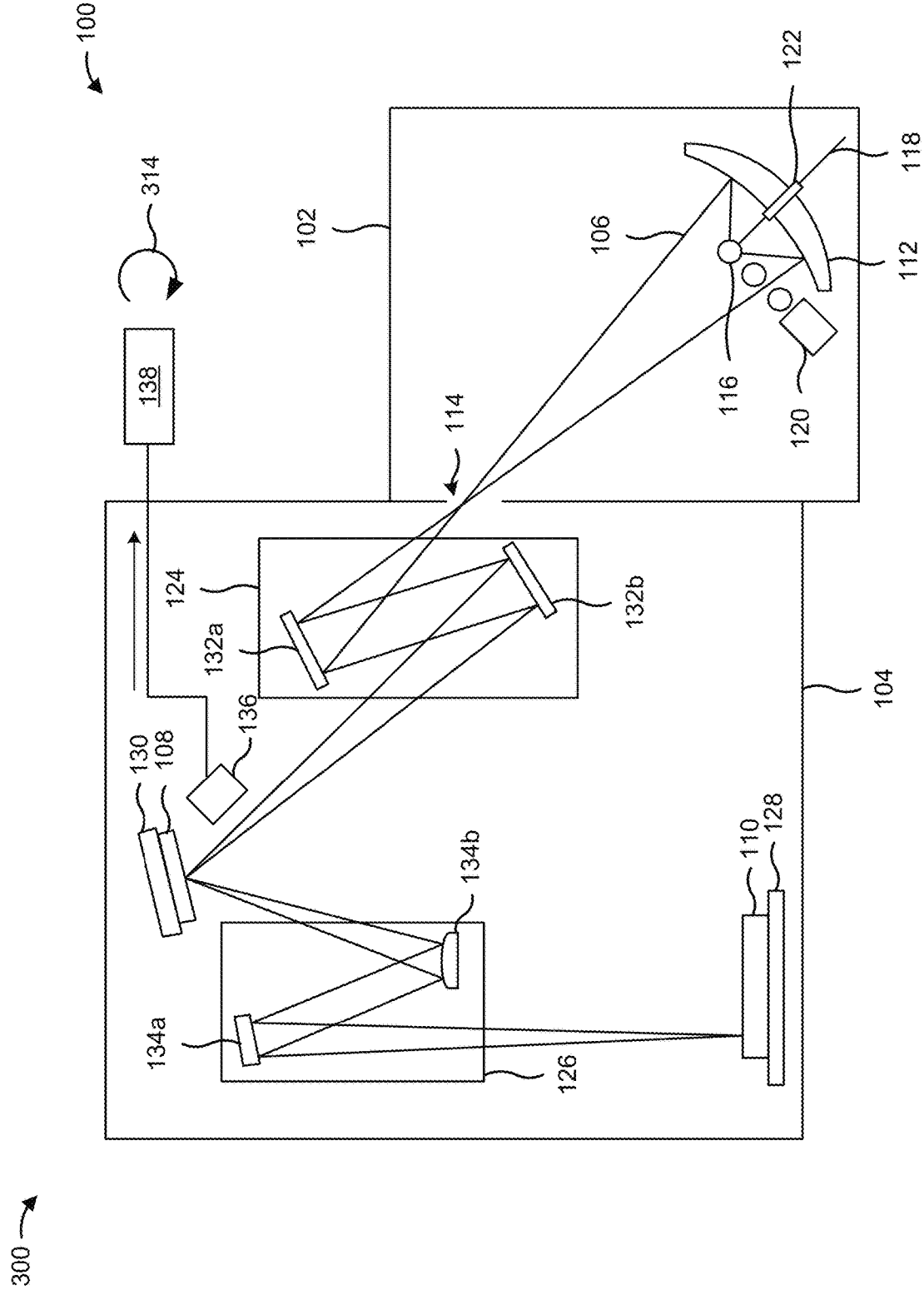

As shown in FIG. 3H, the lithography system 100 performs the exposure operation with the pre-heated reticle 108. The exposure operation includes transferring a pattern of the reticle 108 to a plurality of semiconductor substrates 110 in a semiconductor substrate lot. The exposure operation may be performed with the same or similar exposure parameters, such as the same or similar energy level for the radiation source 102, the same or similar radiation dosage, the same or similar pupil size and/or shape, and/or the same or similar exposure duration, among other examples. In some implementations, the thermal camera 136 generates temperature data during the exposure operation such that the temperature of the reticle 108 may be monitored as the semiconductor substrates 110 are processed. In particular, the thermal camera 136 generates temperature data associated with the temperature of the reticle 108 while the semiconductor substrates 110 are processed in the exposure operation. The thermal camera 136 provides the temperature data to the controller 138. As shown by reference number 314, the controller 138 may determine another saturation temperature for the reticle 108, may determine pre-heating adjustments, and/or may perform one or more other actions based on the temperature data. The pre-heating adjustments may include an adjusted temperature parameter (e.g., an increased pre-heating temperature or a decreased pre-heating temperature) for pre-heating the reticle 108, an adjusted time duration parameter (e.g., an increased pre-heating time duration or a decreased pre-heating time duration), and/or another adjusted parameter.

Figure 3I:
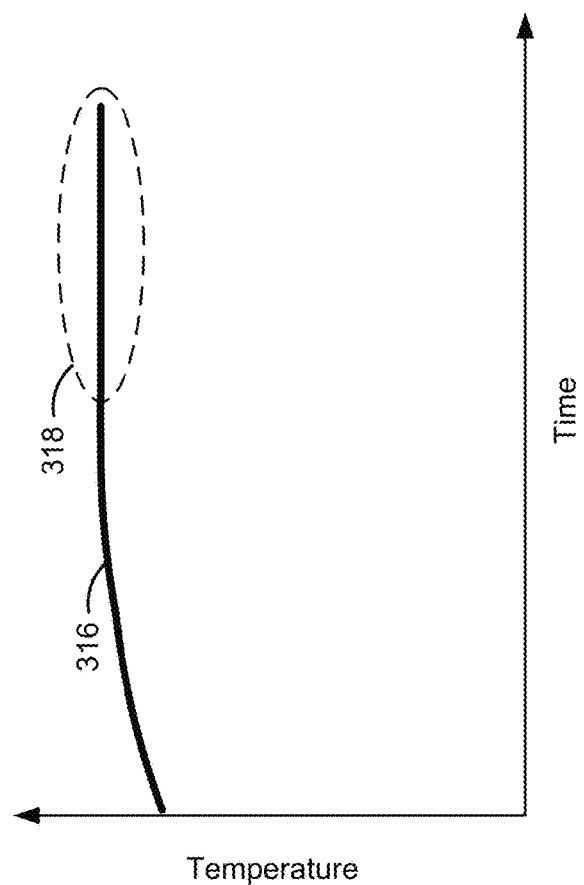

As shown in FIG. 3I, the temperature 316 of the reticle 108 during the exposure operation is more stable and consistent, and reaches a saturation temperature 318 quicker, when the reticle 108 is pre-heated relative to the temperature 306 of the reticle 108 when the reticle 108 is not pre-heated. In some implementations, the temperature 316 of the reticle 108 and/or the saturation temperature 318 of the reticle 108 during the exposure operation is used to adjust and/or tune the one or more heating parameters for the reticle 108 to further decrease temperature variation of the reticle 108.

As indicated above, FIGS. 3A-3I are provided as one or more examples. Other examples may differ from what is described with regard to FIGS. 3A-3I.

Figure 4:
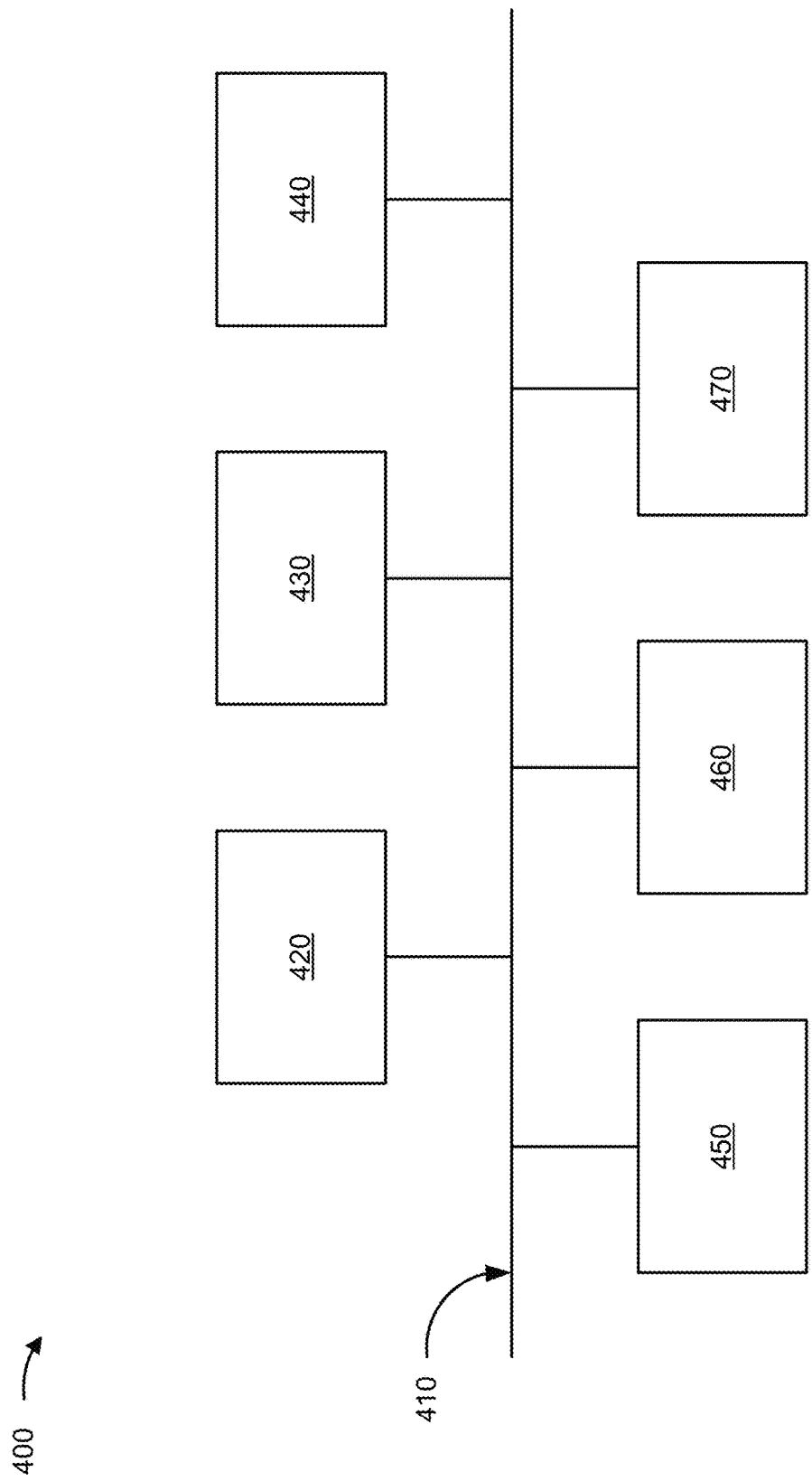
FIG. 4 is a diagram of example components of one or more devices of FIG. 1 described herein.

FIG. 4 is a diagram of example components of a device 400, which may correspond to thermal camera 136, the controller 138, and/or another component described herein. In some implementations, the radiation source 102, the exposure tool 104, the thermal camera 136, the controller 138, the reticle transport system 200 and/or another component described herein may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing device, a graphics processing device, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna.

Device 400 may perform one or more processes described herein. For example, a non-transitory computer-readable medium (e.g., memory 430 and/or storage component 440) may store a set of instructions (e.g., one or more instructions, code, software code, and/or program code) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
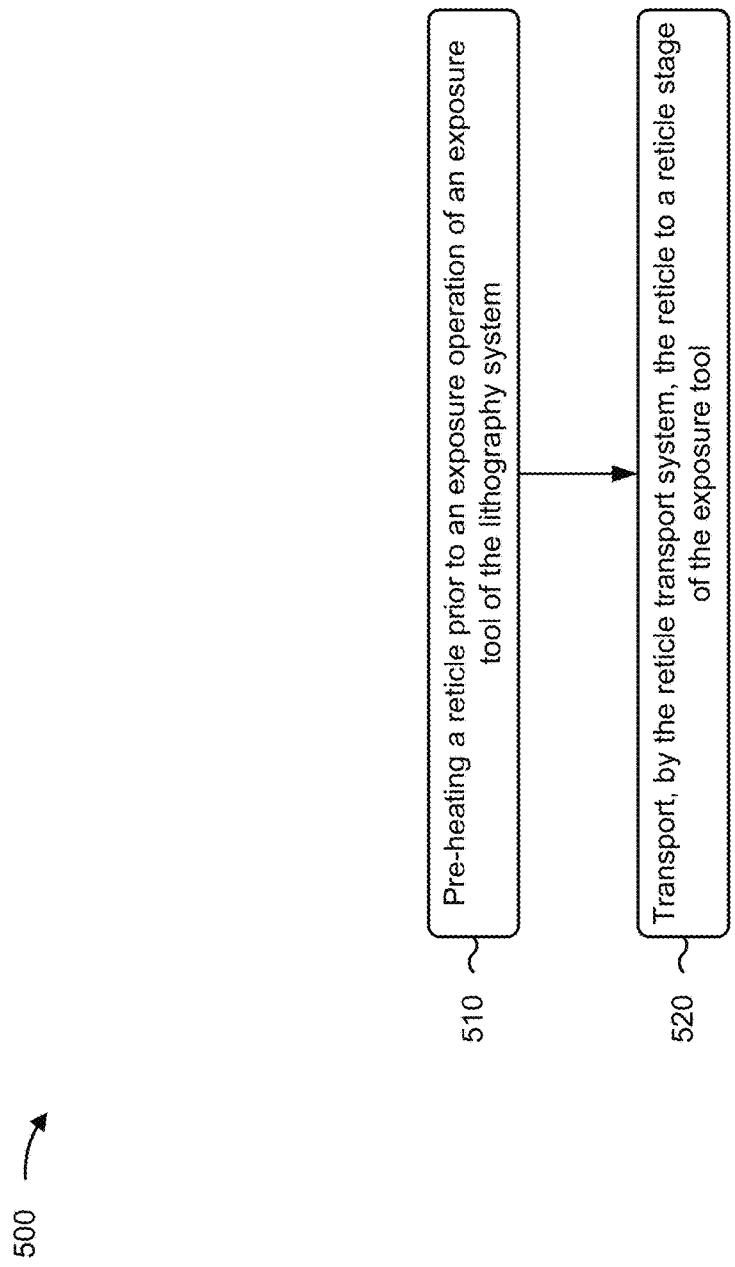
FIGS. 5 and 6 are flowcharts of example processes relating to heating a reticle described herein.

FIG. 5 is a flowchart of an example process 500 associated with heating a reticle. In some implementations, one or more process blocks of FIG. 5 may be performed by a reticle transport system (e.g., the reticle transport system 200). In some implementations, one or more process blocks of FIG. 5 may be performed by another device or a group of devices separate from or including the reticle transport system, such as a lithography system (e.g., the lithography system 100), an exposure tool (e.g., the exposure tool 104), a thermal camera (e.g., the thermal camera 136), and/or a controller (e.g., the controller 138), among other examples. Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include pre-heating a reticle prior to an exposure operation of an exposure tool of the lithography system (block 510). For example, the reticle transport system 200 may pre-heat the reticle 108 prior to an exposure operation of the exposure tool 104 of the lithography system, as described herein.

As further shown in FIG. 5, process 500 may include transporting the reticle to a reticle stage of the exposure tool (block 520). For example, the reticle transport system 200 may transport the reticle 108 to the reticle stage 130 of the exposure tool 104, as described herein. In some implementations, the reticle 108 is pre-heated at least one of prior to transport of the reticle 108 to the reticle stage 130 or during transport of the reticle 108 to the reticle stage 130.

Process 500 may include additional implementations, such as any single implementation or any combination of implementations described below and/or in connection with one or more other processes described elsewhere herein.

In a first implementation, pre-heating the reticle 108 includes pre-heating the reticle 108 using a reticle heater 226 in a storage slot (e.g., a reticle storage slot 224) of a storage device (e.g., the reticle storage device 220) included in the reticle transport system 200. In a second implementation, alone or in combination with the first implementation, pre-heating the reticle 108 includes pre-heating the reticle 108 using the reticle heater 228 on the robot arm (e.g., the reticle transport tool 218) included in the reticle transport system 200. In a third implementation, alone or in combination with one or more of the first and second implementations, pre-heating the reticle 108 includes pre-heating the reticle 108 based on a substrate lot job, in which the reticle 108 is to be used, being added to a processing queue of the lithography system 100.

In a fourth implementation, alone or in combination with one or more of the first through third implementations, pre-heating the reticle 108 pre-heating the reticle 108 for a time duration in a range of approximately 5 minutes to approximately 10 minutes. In a fifth implementation, alone or in combination with one or more of the first through fourth implementations, the exposure operation includes processing a plurality of semiconductor substrates 110 in a substrate lot, and pre-heating the reticle 108 includes pre-heating the reticle 108 to a temperature that is approximately equal to an estimated saturation temperature of the reticle 108 for the exposure operation.

In a sixth implementation, alone or in combination with one or more of the first through fifth implementations, process 500 includes pre-heating another reticle 108 prior to an exposure operation in which another plurality of semiconductor substrates 110 are to be processed in a substrate lot, where the reticle 108 and the other reticle 108 are pre-heated to different temperatures. In a seventh implementation, alone or in combination with one or more of the first through sixth implementations, pre-heating the reticle 108 prior to the exposure operation includes pre-heating the reticle 108 prior to the exposure operation to reduce deformation changes of the reticle 108 during the exposure operation.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
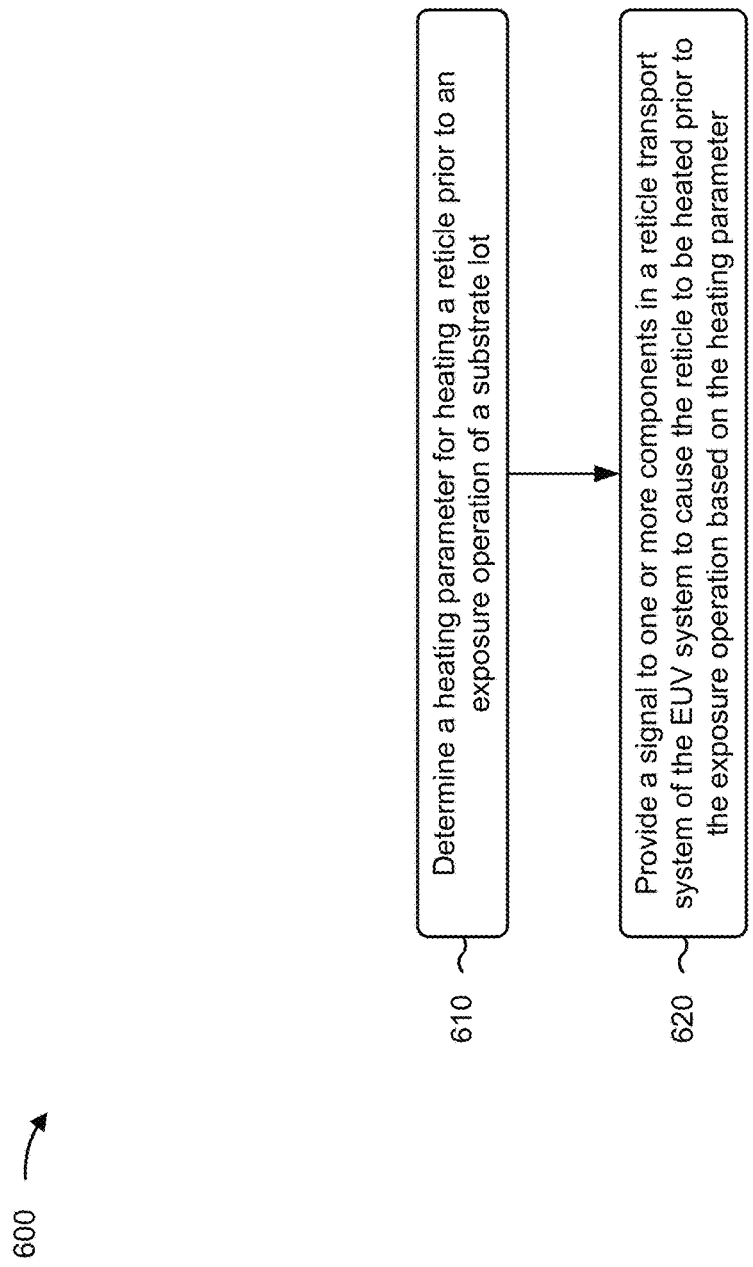

FIG. 6 is a flowchart of an example process 600 associated with heating a reticle. In some implementations, one or more process blocks of FIG. 6 may be performed by a controller (e.g., the controller 138). In some implementations, one or more process blocks of FIG. 6 may be performed by another device or a group of devices separate from or including the reticle transport system, such as a lithography system (e.g., the lithography system 100), an exposure tool (e.g., the exposure tool 104), a thermal camera (e.g., the thermal camera 136), and/or a reticle transport system (e.g., the reticle transport system 200), among other examples. Additionally, or alternatively, one or more process blocks of FIG. 6 may be performed by one or more components of device 400, such as processor 420, memory 430, storage component 440, input component 450, output component 460, and/or communication component 470.

As shown in FIG. 6, process 600 may include determining a heating parameter for heating a reticle prior to an exposure operation of a substrate lot (block 610). For example, the controller 138 may determine a heating parameter for heating the reticle 108 prior to an exposure operation of a substrate lot, as described herein. In some implementations, the controller 138 is included in an EUV system such as the lithography system 100.

As further shown in FIG. 6, process 600 may include providing a signal to one or more components in a reticle transport system of the EUV system to cause the reticle to be heated prior to the exposure operation based on the heating parameter (block 620). For example, the controller 138 may provide a signal to one or more components in the reticle transport system 200 of the EUV system to cause the reticle 108 to be heated prior to the exposure operation based on the heating parameter, as described herein.

Process 600 may include additional implementations, such as any single implementation or any combination of implementations described below and/or in connection with one or more other processes described elsewhere herein.

In a first implementation, determining the heating parameter includes determining the heating parameter based on an estimated saturation temperature for the reticle 108 during the exposure operation. In a second implementation, alone or in combination with the first implementation, determining the heating parameter includes determining the heating parameter based on at least one of a radiation dosage for an exposure operation in which the reticle 108 is to be used, a pupil shape that is to be used in the exposure operation, or temperature data from one or more historical exposure operations associated with the reticle 108.

In a third implementation, alone or in combination with one or more of the first and second implementations, process 600 includes receiving the temperature data from a thermal camera 136 included in an EUV exposure tool (e.g., the exposure tool 104) of the EUV system. In a fourth implementation, alone or in combination with one or more of the first through third implementations, providing the signal to the one or more components includes providing a first signal to a reticle storage slot 224 to cause a temperature of the reticle 108 to be heated based on the heating parameter, and providing a second signal to the reticle transport tool 218 to cause the temperature of the reticle 108 to be maintained during transport of the reticle 108 after the reticle 108 is heated in the reticle storage slot 224. In a fifth implementation, alone or in combination with one or more of the first through fourth implementations, the first signal causes the reticle 108 to be heated in the reticle storage slot 224 for a particular time duration prior to the reticle 108 being retrieved by the reticle transport tool 218.

In a sixth implementation, alone or in combination with one or more of the first through fifth implementations, process 600 includes receiving temperature data associated with a temperature of the reticle 108 during the exposure operation, and determining an adjusted heating parameter for the reticle 108 based on the temperature data. In a seventh implementation, alone or in combination with one or more of the first through sixth implementations, providing the signal to the one or more components to cause the reticle 108 to be heated prior to the exposure operation includes providing the signal to the one or more components to cause the reticle 108 to be heated prior to the exposure operation to reduce a lot overlay heating error for the substrate lot.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a reticle is pre-heated prior to an exposure operation of a semiconductor substrate lot to reduce substrate to substrate temperature variations of the reticle in the exposure operation. The reticle may be pre-heated while being stored in a reticle storage slot, while being transferred from the reticle storage slot to a reticle stage of an exposure tool, and/or in another location prior to being secured to the reticle stage for the exposure operation. In this way, the reduction in temperature variation of the reticle in the exposure operation provided by pre-heating the reticle may reduce overlay deltas and misalignment for the semiconductor substrates that are processed in the exposure operation. This increases overlay performance, increases yield of the exposure tool, and increases semiconductor device quality. Moreover, pre-heating the reticle prior to securing the reticle to the reticle stage for the exposure operation reduces and/or minimizes the impact that the pre-heating has on throughput and processing times of the exposure tool.

As described in greater detail above, some implementations described herein provide a method. The method includes pre-heating, by a reticle transport system of a lithography system, a reticle prior to an exposure operation of an exposure tool of the lithography system. The method includes transporting, by the reticle transport system, the reticle to a reticle stage of the exposure tool, where the reticle is pre-heated at least one of prior to transport of the reticle to the reticle stage or during transport of the reticle to the reticle stage.

As described in greater detail above, some implementations described herein provide a method. The method includes determining, by a controller of an EUV system, a heating parameter for heating a reticle prior to an exposure operation of a substrate lot. The method includes providing, by the controller, a signal to one or more components in a reticle transport system of the EUV system to cause the reticle to be heated prior to the exposure operation based on the heating parameter.

As described in greater detail above, some implementations described herein provide an EUV exposure system. The EUV exposure system includes a reticle stage configured to support a reticle. The EUV exposure system includes a thermal camera configured to generate temperature data associated with the reticle when the reticle is supported by the reticle stage in a first exposure operation. The EUV exposure system includes a controller configured to determine, based on the temperature, one or more parameters for heating the reticle prior to a second exposure operation subsequent to the first exposure operation. The EUV exposure system includes one or more heaters configured to heat the reticle based on the one or more parameters prior to the reticle being placed on the reticle stage for the second exposure operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   determining, by a controller of an extreme ultraviolet (EUV) system, a heating parameter for heating a reticle prior to an exposure operation of a substrate lot;
   providing, by the controller, a first signal to a reticle storage slot to cause a temperature of the reticle to be heated based on the heating parameter; and
   providing, by the controller, a second signal to a reticle transport tool to cause the temperature of the reticle to be maintained during transport of the reticle after the reticle is heated in the reticle storage slot.

2. The method of claim 1, further comprising:
   receiving temperature data, associated with the temperature of the reticle, from a thermal camera included in an EUV exposure tool of the EUV system,
   wherein the heating parameter is determined based on the temperature data.

3. The method of claim 1, wherein the first signal causes the reticle to be heated in the reticle storage slot for a particular time duration prior to the reticle being retrieved by the reticle transport tool.

4. The method of claim 1, further comprising:
   receiving temperature data associated with the temperature of the reticle during the exposure operation; and
   determining an adjusted heating parameter for the reticle based on the temperature data.

5. The method of claim 1, wherein at least one of the first signal or the second signal is provided to reduce a lot overlay heating error for the substrate lot.

6. A method, comprising:
   determining, by a controller of an extreme ultraviolet (EUV) system, a heating parameter, for heating a reticle prior to an exposure operation of a substrate lot, based on an estimated saturation temperature for the reticle during the exposure operation; and
   providing, by the controller, at least one of:
      a first signal to a reticle storage slot to cause a temperature of the reticle to be heated based on the heating parameter, or
      a second signal to a reticle transport tool to cause the temperature of the reticle to be maintained during transport of the reticle after the reticle is heated in the reticle storage slot.

7. The method of claim 6, wherein the heating parameter is further determined based on temperature data from one or more historical exposure operations associated with the reticle.

8. The method of claim 6, wherein the estimated saturation temperature includes a measured or estimated temperature of the reticle at which the measured or estimated temperature does not increase further during a heating operation.

9. The method of claim 6, further comprising:
   determining the estimated saturation temperature based on an average of saturation parameters measured for the exposure operation and one or more historical exposure operations associated with the reticle.

10. The method of claim 6, wherein the temperature of the reticle is approximately equal to the estimated saturation temperature.

11. The method of claim 6, wherein the heating parameter is a temperature parameter that is greater than the estimated saturation temperature.

12. The method of claim 6, further comprising:
receiving, based on providing at least one of the first signal or the second signal, temperature data associated with a temperature of the reticle during the exposure operation;
determining an adjusted saturation parameter for the reticle based on the temperature data; and
determining an adjusted heating parameter based on the adjusted saturation parameter.

13. A method, comprising:
determining, by a controller of an extreme ultraviolet (EUV) system, a heating parameter, for heating a reticle prior to an exposure operation of a substrate lot, based on temperature data from one or more historical exposure operations associated with the reticle; and
providing, by the controller, a signal to one or more components, including one or more reticle heaters, in a reticle transport system of the EUV system to cause the reticle to be heated prior to the exposure operation based on the heating parameter.

14. The method of claim 13, wherein the signal causes the one or more reticle heaters to be activated to heat the reticle while the reticle is in a reticle storage slot.

15. The method of claim 13, wherein providing the signal comprises:
automatically providing the signal to the one or more components based on an event associated with the reticle.

16. The method of claim 13, wherein providing the signal to the one or more components comprises at least one of:
providing a first signal to a first reticle heater, of the one or more reticle heaters, in a reticle storage slot to cause a temperature of the reticle to be heated based on the heating parameter; or
providing a second signal to a second reticle heater, of the one or more reticle heaters, a reticle transport tool to cause the temperature of the reticle to be maintained during transport of the reticle after the reticle is heated in the reticle storage slot.

17. The method of claim 13, further comprising:
receiving temperature data associated with a temperature of the reticle during the exposure operation; and
determining an adjusted heating parameter for the reticle based on the temperature data.

18. The method of claim 13, wherein providing the signal to the one or more components to cause the reticle to be heated prior to the exposure operation comprises:
providing the signal to the one or more components to cause the reticle to be heated prior to the exposure operation to reduce a lot overlay heating error for the substrate lot.

19. The method of claim 1, wherein determining the heating parameter comprising:
determining, based on temperature data associated with a first exposure operation of the substrate lot, a heating parameter for heating a reticle prior to a second exposure operation of the substrate lot.

20. The method of claim 6, wherein determining the heating parameter comprising:
determining, based on temperature data associated with a first exposure operation of the substrate lot, a heating parameter for heating a reticle prior to a second exposure operation of the substrate lot.

* * * * *